(12) United States Patent
Lin et al.

(10) Patent No.: US 8,907,736 B2
(45) Date of Patent: Dec. 9, 2014

(54) DIGITAL PULSE WIDTH MODULATION CONTROLLER

(71) Applicant: Inno-Tech Co., Ltd., Taipei (TW)

(72) Inventors: Chih Feng Lin, Taipei (TW); Shu-Chia Lin, Taipei (TW); Wen-Yueh Hsieh, Taipei (TW); Ching-Yuan Lin, Taipei (TW); Ting-Chin Tsen, Taipei (TW); Yi-Pin Chen, Taipei (TW)

(73) Assignee: Inno-Tech Co., Ltd., Taipei (TW)

( * ) Notice: Subject to any disclaimer, the term of this patent is extended or adjusted under 35 U.S.C. 154(b) by 0 days.

(21) Appl. No.: 14/022,919

(22) Filed: Sep. 10, 2013

(65) Prior Publication Data

US 2014/0218125 A1    Aug. 7, 2014

(30) Foreign Application Priority Data

Dec. 5, 2012   (TW) .............................. 101145787 A

(51) Int. Cl.
*H03K 7/08* (2006.01)
*H02M 3/335* (2006.01)
*H02M 1/08* (2006.01)
*H02M 1/38* (2007.01)

(52) U.S. Cl.
CPC ............. *H03K 7/08* (2013.01); *H02M 3/33507* (2013.01); *H02M 1/08* (2013.01); *H02M 1/38* (2013.01)
USPC .......................................... 332/109; 323/283

(58) Field of Classification Search
USPC .......................................... 323/283; 332/109
See application file for complete search history.

(56) References Cited

U.S. PATENT DOCUMENTS

| | | | |
|---|---|---|---|
| 8,115,564 B2 * | 2/2012 | Kost | 332/109 |
| 2005/0116698 A1 * | 6/2005 | Prinz et al. | 323/283 |
| 2011/0234190 A1 * | 9/2011 | Kenly et al. | 323/283 |
| 2012/0153917 A1 * | 6/2012 | Adell et al. | 323/283 |
| 2012/0326688 A1 * | 12/2012 | Sun et al. | 323/283 |
| 2013/0033319 A1 * | 2/2013 | Chen et al. | 330/251 |

* cited by examiner

*Primary Examiner* — Joseph Chang
(74) *Attorney, Agent, or Firm* — Lin & Associates IP, Inc.

(57) ABSTRACT

A digital pulse width modulation controller includes a pulse width modulation controller, a selection unit having at least one selector, a comparison unit having at least one comparator, and a signal conversion unit having at least one digital-to-analog converter. The digital-to-analog converter generates a reference current and/or voltage. The comparator receives the reference current and/or voltage, and performs a comparison operation to generate a comparison signal based on a feedback signal. The selector selects one selection signal to input into the pulse width modulation controller, which receives other parameters set by a user or the system at the same time so as to control characteristics of the digital pulse width modulation signals, thereby improving the electric properties of a loading circuit.

10 Claims, 3 Drawing Sheets

DIGITAL PULSE WIDTH MODULATION CONTROLLER

CROSS-REFERENCE TO RELATED APPLICATION

This application claims the priority of Taiwanese patent application No. 101145787, filed on Dec. 5, 2012, which is incorporated herewith by reference.

BACKGROUND OF THE INVENTION

1. Field of the Invention

The present invention relates to a pulse width modulation controller, and more specifically to a digital pulse width modulation controller, which dynamically changes the resolution of the duty of the current pulse width modulation signal based on the change state of the duty of the previous pulse width modulation signal.

2. The Prior Arts

In the prior arts, the technology of pulse width modulation (PWM) is primarily used to modulate the pulse signal with specific frequency to generate the corresponding PWM signal by changing the width of the pulse according to specific conditions. The PWM signal then drives switching elements for electric devices or loading circuits, such as light emitting diodes (LEDs), electric motors or power converters. In general, the minimum adjustable unit of the pulse width is referred as "resolution". For instance, the resolution of the pulse signal with the frequency of 100 KHz is 1/100K second.

As for the application of driving two switching elements, the PWM technology have to generate two corresponding PWM signals, each having the same width/frequency and reversed polarity, that is, one PWM signal is high/low level when another PWM signal is low/high level, so as to avoid turning on or conducting the two switching elements at the same time, which may cause extremely large current to flow through the loading circuit and even lead to short-circuiting with permanent damage.

To achieve the above function, the traditional means is implemented by the analog or digital circuits with the feedback control loop. For the analog solution, the PWM frequency is generated by the built-in oscillator, and it is not possible to freely change the PWM frequency according to the actual situation. In particular, the compensation of the internal amplifier commonly used in the conventional feedback control loop is not adjustable. In addition, it is not easy to change the output voltage and the loading range, which are usually preset.

For the current digital solution with digital power function, the analog feedback signal generated by fast sampling operation provided with the analog-to-digital converter (ADC) is required and then is controlled by the digital signal processing (DSP) engine, such as Proportional-Integral-Derivative (PID) control. However, higher resolution needs faster operating frequency, and at the same time, the sampling frequency of the ADC has to be higher enough. As a result, the above digital solution results in higher cost, and is not feasible for most of the actual applications.

Moreover, the conventional solutions can not dynamically change the interval when the two pulse signals are specified to low level at the same time to improve the electric performance of the loading, like the average power consumption.

Therefore, it is urgently needed to provide a digital pulse width modulation controller, which can dynamically adjust the resolution of the duty of the current PWM signal to overcome the above problems in the prior arts.

SUMMARY OF THE INVENTION

The primary objective of the present invention is to provide a digital pulse width modulation (PWM) controller, which includes a pulse width modulation controller, a selection unit, a comparison unit and a signal conversion unit. The PWM controller generates two digital PWM signals with different or the same dead time interval, used to drive a loading circuit. The dead time interval is the time interval when the two digital PWM signals are low level.

The selection unit includes at least one selector. The comparison unit includes at least one comparator. The signal conversion unit includes at lest one digital-to-analog converter (DAC). Each DAC receives a reference signal with a static or dynamic level, which is converted into a corresponding reference current and/or voltage. Each comparator receives the reference current and/or voltage and a specific feedback signal from the loading circuit, and performs a comparison operation to generate a corresponding comparison signal, which is a digital signal with low or high level. Each selector selects one selection signal as an input signal which is input into the PWM controller. The PWM controller can receive other parameters set by the user or the system at the same time to control the aspects of the PWM signals, thereby greatly improving the electric properties of the loading circuit.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1:
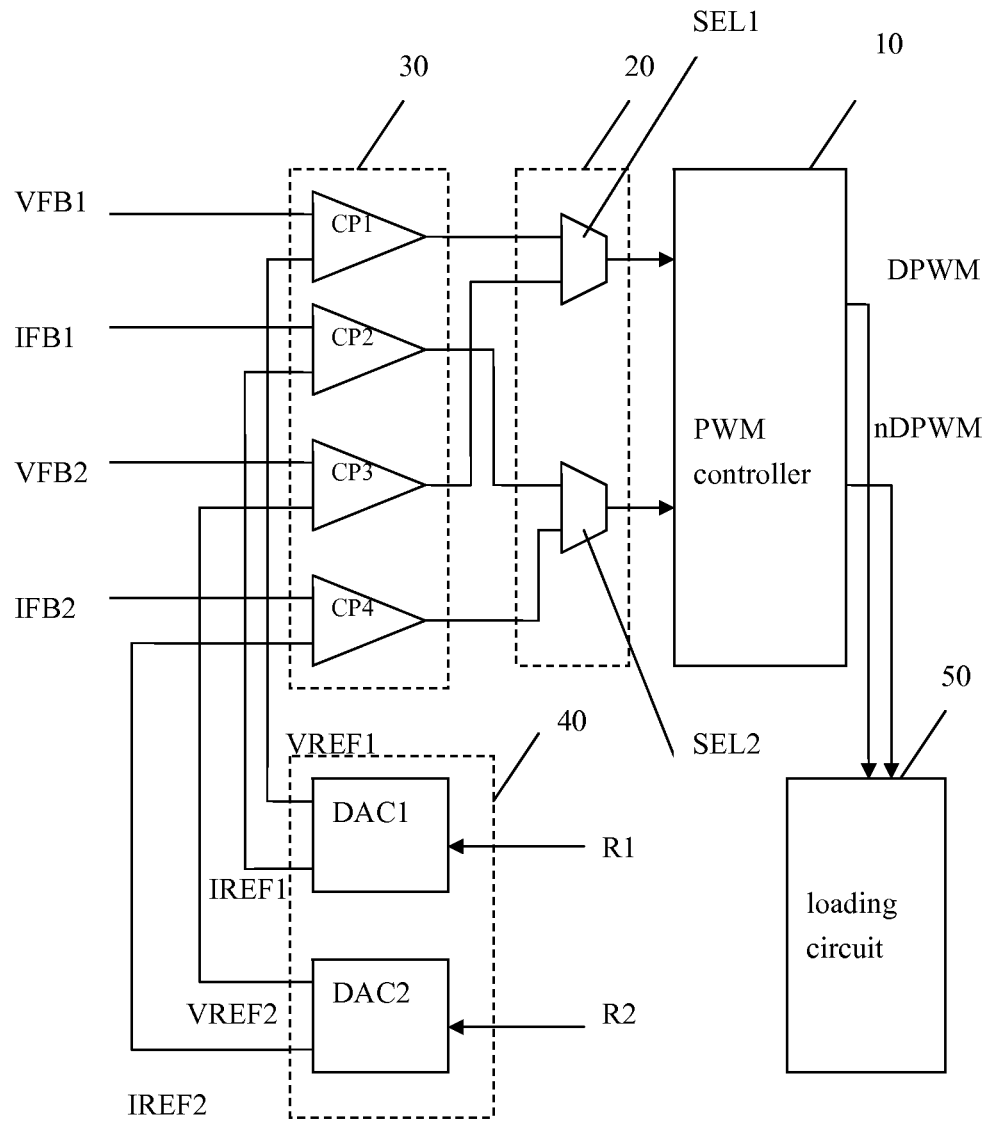
FIG. 1 is a schematic view illustrating an embodiment of a digital pulse width modulation controller according to the present invention.

FIG. 1 is a schematic view illustrating an embodiment of a digital pulse width modulation controller according to the present invention. As shown in FIG. 1, the digital pulse width modulation controller of the present invention generally includes a pulse width modulation (PWM) controller 10, a selection unit 20, a comparison unit 30 and a signal conversion unit 40. The PWM controller 10 generates at least two digital PWM signals such as DPWM and nDPWM, for driving a loading circuit 50. The loading circuit 50 preferably includes two power transistors, like MOSFETs (metal-oxide-semiconductor field effect transistors), for receiving the digital PWM signals DPWM and nDPWM so as to perform the single-ended output mode or the push-pull output mode. Specifically, the two digital PWM signals DPWM and nDPWM do not have the dead time interval in the single-ended output mode, and the two digital PWM signals DPWM and nDPWM have the dead time interval in the push-pull output mode. It should be noted that the dead time interval mentioned in the present description refers to the time interval when the two digital PWM signals DPWM and nDPWM are low level.

The PWM controller 10 performs digital operations and is implemented by a group consisting of a MCU (microcontroller), a CPU (central processing unit) or an electronic circuit consisting of electronic elements.

The selection unit 20 includes at least one selector, such as SEL1 and SEL2, the comparison unit 30 includes at least one comparator, such as CP1, CP2, CP3 and CP4, and the signal conversion unit 40 includes at least one digital-to-analog converter (DAC), such as DAC1 and DAC2.

The digital-to-analog converters DAC1 and DAC2 of signal conversion unit 40 respectively receive two different reference signals R1 and R2, which are then converted into a corresponding reference voltage VREF1 and/or reference current IREF1, and a corresponding reference voltage VREFR2 and/or reference current IREF2. Each of the reference signals R1 and R2 is the signal with a static level like the low level (logic 0) or the high level (logic 1), or a variant signal like a square wave or a sine wave.

Each of the comparators CP1, CP2, CP3 and CP4 of the comparison unit 30 respectively receives one of the reference voltage VREF1, the reference current IREF1, the reference voltage VREF2 and the reference current IREF2, and one of the specific feedback signals such as the voltage feedback signal VFB1, the current voltage feedback signal IFB1, the voltage feedback signal VFB2 and the current feedback signal IFB2. The comparators CP1, CP2, CP3 and CP4 perform the comparison operation to generate the corresponding comparison signals, which are digital signals with the low level or the high level.

Each one of the selectors SEL1 and SEL2 receives two of the comparison signals from the comparison unit 30, and selects one of the two comparison signals as the corresponding input signal based on the selection signal (not shown), which is preset by the user or the system. The input signal is fed into the PWM controller 10.

Figure 2:
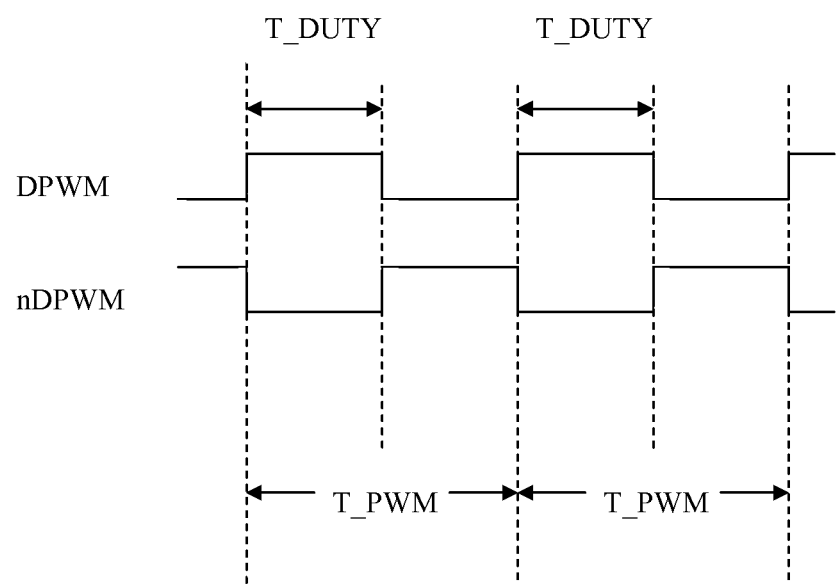
FIG. 2 is a waveform plot showing the PWM signals generated by the digital pulse width modulation controller according to the embodiment of the present invention.
Figure 3:
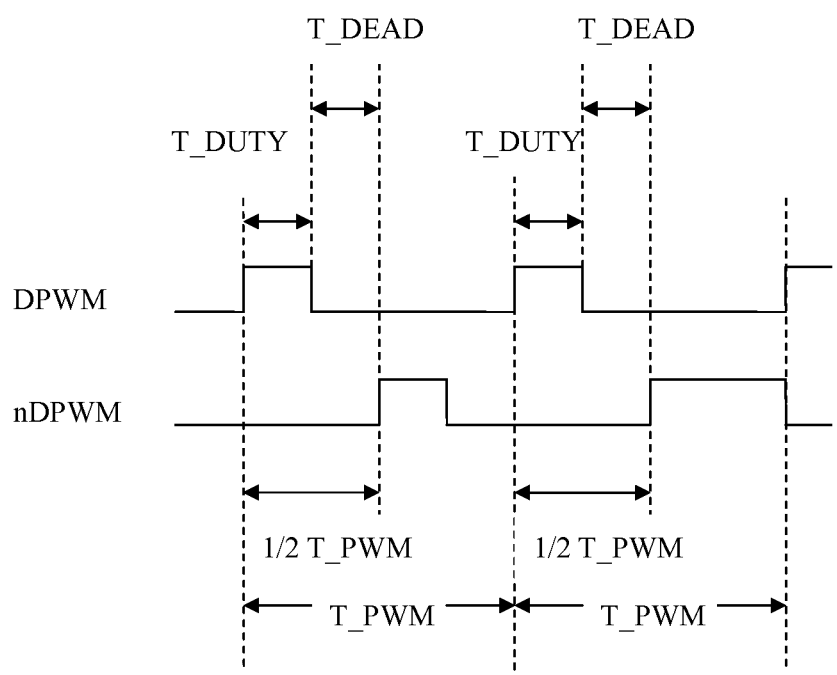
FIG. 3 is another waveform plot showing the PWM signals generated by the digital pulse width modulation controller according to the embodiment of the present invention.

In addition, The PWM controller 10 receives other parameters preset by the user or the system at the same time to control the aspects of the digital PWM signals DPWM and nDPWM, such as the PWM period T_PWM, the duty T_duty, the dead time interval T_DEAD shown in FIGS. 2 and 3, or the PWM output mode, the soft start period, run/stop, the over-current protection, shutdown not shown in FIGS. 2 and 3.

For example, the PWM controller 10 sets the dead time interval T_DEADS by changing the number of the resolution of the digital PWM signal DPWM and nDPWM. That is, the duty becomes larger when the number of the resolution is increased, and the duty is smaller when the number of the resolution is decreased. Specifically, the resolution refers to the minimum changeable unit for the duty, and the number of the resolution is changed according to one of the following four determination rules.

The first determination rule includes the steps of: the PWM controller 10 increases N2 resolutions for the duty of the digital PWM signals DPWM and nDPWM in the current PWM period if the comparison signal generated by the comparison unit 30 contains N1 successive low levels as logic 0 within a previous PWM period, wherein N1 and N2 are positive integers preset by the user or the system; and the PWM controller 10 decreases N2 resolutions for the duty of the digital PWM signals DPWM and nDPWM in the current PWM period if the comparison signal contains N1 successive high levels as logic 1 within the previous PWM period.

The second determination rule includes the steps of: if a difference subtracting a number of low level from a number of high level in the comparison signal within the previous PWM period is larger than a parameter N1, then the PWM controller 10 decreases N2 resolutions for the duty of the digital PWM signals DPWM and nDPWM in the current PWM period; and if a difference subtracting the number of high level from the number of low level within the previous PWM period is larger than the parameter N1, then the PWM controller 10 increases N2 resolutions for the duty of the digital PWM signals DPWM and nDPWM in the current PWM period.

The third determination rule includes the steps of: the PWM controller 10 decreases 2*N1 resolutions for the duty of the digital PWM signals DPWM and nDPWM in the current PWM period if the duties in two successively previous PWM periods are the increasing duties, the duty in the previous PWM period is increased by N1 resolutions, and the current duty is determined as the increasing duty (that is, double increased); and the PWM controller 10 decreases 2*N2 resolutions for the duty of the digital PWM signals DPWM and nDPWM in the current PWM period if the duties in two successively previous PWM periods are the decreasing duties, the duty in the previous PWM period is increased by N2 resolutions, and the current duty is determined as the decreasing duty (that is, double decreased).

The fourth determination rule includes the steps of: the PWM controller 10 increases (N1)/2 resolutions for the duty of the digital PWM signals DPWM and nDPWM in a current PWM period if the duties in two successively previous PWM periods are the increasing duties, the duty in the previous PWM period is decreased by N1 resolutions, and the current duty is determined as the increasing duty (that is, increased by one half); and the PWM controller 10 decreases (N2)/2 resolutions for the duty of the digital PWM signals DPWM and nDPWM in the current PWM period if the duties in two successively previous PWM periods are the decreasing duties, the duty in the previous PWM period is increased by N2 resolutions, and the current duty is determined as the decreasing duty (that is, decreased by one half).

From the above description, one feature of the present invention is that the number of the resolution of the duty of the PWM signal in the current period is dynamically changed according to the state that the duty in the previous period is increased or decreased, thereby generating the PWM signals with the optimal dead time interval for driving the loading circuit, and improving the electric characteristics of the loading circuit.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A digital pulse width modulation controller for generating at least two digital pulse width modulation (PWM) signals used to drive a loading circuit, comprising:

a signal conversion unit including at least one digital-to-analog converter (DAC), each receiving a different reference signal and generating a corresponding reference voltage and/or current;

a comparison unit including at least one comparator for receiving the reference voltage and/or current from the corresponding DAC of the signal conversion unit, performing a comparison operation, and generating a comparison signal with a low or high level based on a feedback signal from the loading circuit;

a selection unit for receiving a selection signal and the comparison signals from the comparison unit and including at least one selector for selecting one selection signal serving as an input signal based on the selection signal; and a pulse width modulation (PWM) controller for receiving the input signals from the selection unit and/or parameters preset by a user or a system, and controlling a number of resolutions of a duty of the digital PWM signals based on at least one determination rule to change a dead time interval between the digital PWM signals, wherein the resolution is a minimum changeable unit of the duty, and the dead time interval is a time interval when the digital PWM signals are low level.

2. The digital pulse width modulation controller as claimed in claim 1, wherein the reference signal is a signal with a static level or a variant signal, the static level consists of a low level (logic 0) or a high level (logic 1), and the variant signal consists of a square wave or a sine wave.

3. The digital pulse width modulation controller as claimed in claim 1, wherein the feedback signal from the loading circuit consists of at least one of a voltage feedback signal and a current feedback signal.

4. The digital pulse width modulation controller as claimed in claim 1, wherein the selection signal is set by the user or the system.

5. The digital pulse width modulation controller as claimed in claim 1, wherein the PWM controller is implemented by a group of consisting of a microcontroller (MCU), a central processing unit (CPU) or an electronic circuit consisting of electronic elements.

6. The digital pulse width modulation controller as claimed in claim 1, wherein the determination rule includes:

the PWM controller increases N2 resolutions for the duty of the digital PWM signals in a current PWM period if the comparison signal generated by the comparison unit contains N1 successive low levels as logic 0 within a previous PWM period; and the PWM controller decreases N2 resolutions for the duty of the digital PWM signals in the current PWM period if the comparison signal contains N1 successive high levels as logic 1 within the previous PWM period, wherein N1 and N2 are positive integers preset by the user or the system.

7. The digital pulse width modulation controller as claimed in claim 1, wherein the determination rule includes:

the PWM controller decreases N2 resolutions for the duty of the digital PWM signals in a current PWM period if a difference subtracting a number of low level from a number of high level in the comparison signal generated by the comparison unit within a previous PWM period is larger than a parameter N1; and the PWM controller increases N2 resolutions for the duty of the digital PWM signals in the current PWM period if a difference subtracting the number of high level from the number of low level in the comparison signal within the previous PWM period is larger than the parameter N1, wherein N1 and N2 are positive integers preset by the user or the system.

8. The digital pulse width modulation controller as claimed in claim 1, wherein the determination rule includes:

the PWM controller decreases 2*N1 resolutions for the duty of the digital PWM signals in a current PWM period if two duties in two successively previous PWM periods are increasing duties, the duty in the previous PWM period has N1 increased resolutions, and a current duty is determined as the increasing duty; and the PWM controller decreases 2*N2 resolutions for the duty of the digital PWM signals in the current PWM period if two duties in two successively previous PWM periods are decreasing duties, the duty in the previous PWM period has N2 increased resolutions, and the current duty is determined as the decreasing duty, wherein N1 and N2 are positive integers preset by the user or the system.

9. The digital pulse width modulation controller as claimed in claim 1, wherein the determination rule includes:

the PWM controller increases N1/2 resolutions for the duty of the digital PWM signals in a current PWM period if two duties in two successively previous PWM periods are increasing duties, the duty in the previous PWM period has N1 decreased resolutions, and a current duty is determined as the increasing duty; and the PWM controller decreases N2/2 resolutions for the duty of the digital PWM signals in the current PWM period if two duties in two successively previous PWM periods are decreasing duties, the duty in the previous PWM period has N2 increased resolutions, and the current duty is determined as the decreasing duty, wherein N1 and N2 are positive integers preset by the user or the system.

10. The digital pulse width modulation controller as claimed in claim 1, wherein the PWM controller further receives the parameters preset by the user or the system for controlling the PWM period, a PWM output mode, a soft start period, run/stop, an over-current protection or shutdown of the digital PWM signals, and the output mode includes a Single-Ended Output Mode without the dead time interval in the two digital PWM signals, and a Push-Pull Output Mode with the dead time interval in the two digital PWM signals.

* * * * *